United States Patent [19]

Pribetich

[11] Patent Number: 5,416,719
[45] Date of Patent: May 16, 1995

[54] COMPUTERIZED GENERATION OF TRUTH TABLES FOR SEQUENTIAL AND COMBINATORIAL CELLS

[75] Inventor: Olivier Pribetich, Vallaurais, France

[73] Assignee: VLSI Technology, Inc., San Jose, Calif.

[21] Appl. No.: 991,915

[22] Filed: Dec. 17, 1992

[51] Int. Cl.⁶ ............................................. G06F 15/60
[52] U.S. Cl. .................................. 364/489; 364/488; 364/490; 364/491; 364/578
[58] Field of Search ............... 364/488, 489, 490, 491, 364/715.01, 578, 716; 395/500, 600

[56] References Cited

U.S. PATENT DOCUMENTS

| | | | |
|---|---|---|---|
| 4,551,814 | 11/1985 | Moore et al. | 364/716 |
| 4,591,993 | 5/1986 | Griffin et al. | 364/491 |
| 4,703,435 | 10/1987 | Darringer et al. | 364/489 |
| 4,792,909 | 12/1988 | Serlet | 364/491 |
| 4,882,690 | 11/1989 | Shinsha et al. | 364/490 |
| 4,922,432 | 5/1990 | Kobayashi et al. | 364/490 |
| 4,967,367 | 10/1990 | Piednoir | 364/489 |
| 5,084,824 | 1/1992 | Lam et al. | 364/490 |
| 5,146,583 | 9/1992 | Matsunaka et al. | 395/500 |
| 5,222,030 | 6/1993 | Dangelo et al. | 364/489 |
| 5,237,513 | 8/1993 | Kaplan | 364/490 |
| 5,258,919 | 11/1993 | Yamanouchi et al. | 364/489 |
| 5,301,318 | 4/1994 | Mital | 395/600 |

OTHER PUBLICATIONS

Westerhoff (1988) "Accugen(TM): An ASIC Modeling Strategy" Electronic Design Automation pp. 33–47; Jan. 1988.

Dreesen (1990) "Standard Cell Development Flow" IEEE pp. 450–455; Jan. 1990.

Aho et al. "Design and Analysis of Algorithms", pp. 10–17 and 75–106.

Primary Examiner—Kevin J. Teska
Assistant Examiner—Jacques H. Louis-Jacques
Attorney, Agent, or Firm—Bowles Horton

[57] ABSTRACT

A computerized method of generating a truth table of a cell in a library of circuit cells includes representing basic elements of the cells in a hardware description language, representing each cell as a set of equations in that language and parsing the equations each in accordance with a respective abstract data tree of which the 'leaves' or extremities are signal values or constants. The parsing of each equation yields a respective partial truth table. The partial truth tables are merged to provide a complete truth table, which is preferably subjected to Boolean and/or expression optimization to reduce the number of entries in the truth table.

12 Claims, 9 Drawing Sheets

| SDN | CDN | CP | D | Q  QN |
|-----|-----|----|----|-------|
| 0 | 0 | 0 | 0 | 0 0 |
| 0 | 0 | 0 | 1 | 0 0 |
| 0 | 0 | 1 | 0 | 0 0 |
| 0 | 0 | 1 | 1 | 0 0 |
| 0 | 0 | R | 0 | 0 0 |
| 0 | 0 | R | 1 | 0 0 |
| 0 | 0 | F | 0 | 0 0 |
| 0 | 0 | F | 1 | 0 0 |
| 0 | 1 | 0 | 0 | 1 0 |
| 0 | 1 | 0 | 1 | 1 0 |
| 0 | 1 | 1 | 0 | 1 0 |
| 0 | 1 | 1 | 1 | 1 0 |
| 0 | 1 | R | 0 | 1 0 |
| 0 | 1 | R | 1 | 1 0 |
| 0 | 1 | F | 0 | 1 0 |
| 0 | 1 | F | 1 | 1 0 |
| 1 | 0 | 0 | 0 | 0 1 |
| 1 | 0 | 0 | 1 | 0 1 |
| 1 | 0 | 1 | 0 | 0 1 |
| 1 | 0 | 1 | 1 | 0 1 |
| 1 | 0 | R | 0 | 0 1 |
| 1 | 0 | R | 1 | 0 1 |
| 1 | 0 | F | 0 | 0 1 |
| 1 | 0 | F | 1 | 0 1 |
| 1 | 1 | 0 | 0 | Q QN |
| 1 | 1 | 0 | 1 | Q QN |
| 1 | 1 | 1 | 0 | Q QN |
| 1 | 1 | 1 | 1 | Q QN |
| 1 | 1 | R | 0 | 0 1 |
| 1 | 1 | R | 1 | 1 0 |
| 1 | 1 | F | 0 | Q QN |
| 1 | 1 | F | 1 | Q QN |

FIG. 10

| Q | OE | QZ |
|---|----|----|
| 0 | 0 | Z |
| 0 | 1 | 0 |
| 1 | 0 | Z |
| 1 | 1 | 1 |

FIG. 13

| SDN CDN CP SA DA DB OE | Q QN QZ |
|---|---|
| 00????0 | 00Z |
| 00????1 | 000 |
| 01????0 | 10Z |
| 01????1 | 101 |
| 10????0 | 01Z |
| 10????1 | 010 |
| 110???0 | Q QN Z |
| 110???1 | Q QN Q |
| 111???0 | Q QN Z |
| 111???1 | Q QN Q |
| 11R0?00 | 01Z |
| 11R0?01 | 010 |
| 11R0?10 | 10Z |
| 11R0?11 | 101 |
| 11R10?0 | 01Z |
| 11R10?1 | 010 |
| 11R11?0 | 10Z |
| 11R11?1 | 100 |
| 11F???0 | Q QN Z |
| 11F???1 | Q QN Q |

FIG. 14

| SDN CDN CP SA DA DB OE | Q QN QZ |
|---|---|
| 00????0 | 00Z |
| 00????1 | 000 |
| 01????0 | 10Z |
| 01????1 | 101 |
| 10????0 | 01Z |
| 10????1 | 01Z |
| 110???0 | Q QN Z |
| 110???1 | Q QN Q |
| 111???0 | Q QN Z |
| 111???1 | Q QN Q |
| 11R0??0 | DB ⁻DB Z |
| 11R0??1 | DB ⁻DB DB |
| 11R1??0 | DA ⁻DA Z |
| 11R1??1 | DA ⁻DA DA |
| 11F???0 | Q QN Z |
| 11F???1 | Q QN Q |

COMPUTERIZED GENERATION OF TRUTH TABLES FOR SEQUENTIAL AND COMBINATORIAL CELLS

FIELD OF THE INVENTION

The present invention relates generally to computer aided design of integrated circuits and particularly to the automatic computation of truth tables for circuits stored as cells in a cell library forming part of a computerized system for the design and layout of integrated circuits, particularly application-specific integrated circuits.

BACKGROUND OF THE INVENTION

Virtually all large scale integrated circuits are now designed in detail by means of a computerized design tool, that is to say a data processor which is loaded with a program (usually called a 'compiler'). A circuit designer provides input data representing, usually in architecturally independent form, a specification of a circuit which is to be ultimately realized in the form of an integrated circuit. The input data generally represents a circuit in a high level schematic form; a display device employing icons representing basic data processing functions may be manipulated on a display screen and an associated program may convert the icon representation into data defining the high level specification in an appropriate machine language. The computerized design tool or machine converts, in accordance with established practice, the high level specification into a netlist, which defines the integrated circuit in terms of basic circuits or cells and their interconnections. Methods exist for the conversion of the netlist by automatic data processing into masks employed in the fabrication of the integrated circuit.

Established methods of design include automatic optimization procedures by means of which circuits can be rendered in a form which is better adapted for fabrication, or rearranged to improve throughput or speed of operation of the final integrated circuit. Other established methods include the modification of a provisional netlist into a revised form, generally for the same purposes of improving performance, or reducing the area occupied by the integrated circuit.

In order to facilitate the design of very large scale integrated circuits, modern methods of automatic synthesis employ a cell library. This is, in practical form, stored data representing the structure and a variety of operational parameters of each of a large number of basic circuit elements, such as AND gates, OR gates, inverters, flip-flops and suchlike, which will be used in large numbers in any integrated circuit. As noted in for example Kobayashi et al., U.S. Pat. No. 4922432 issued 1 May 1990, the use of a cell library greatly facilitates the automated design process. In particular, the functional, architecture independent, specification of the desired circuit is translated, by the machine, into an architecture specific, structural level definition of an integrated circuit. The data representing the structural level definition includes a list of the integrated circuit hardware cells needed to achieve the hardware specifications. These cells are selected, by the machine, from a cell library of previously designed hardware cells of various functions and specification. The machine also generates data paths interconnecting the selected hardware cells. The selected hardware cells and their interconnections constitute the netlist from which, as is noted above, it is possible to employ existing layout systems to generate the chip level masked data required to produce the integrated circuit in chip form.

An important aspect of the use of a cell library is its development, i.e. the conversion of the data representing the various hardware elements and their parameters into a different form. One reason for so doing is to render the cells better adapted for use in simulators or in optimization of netlists.

The compilation of a cell library is a formidable and lengthy task and its development hardly less so. Each hardware cell has to be modelled, both in respect of its function and in respect of its detailed performance. As noted by, for example, Westhoff in Electronic Design Automation 1988, pages 33–47, up to fifty primitives may be required to model all the pin-to-pin delay paths and timing checks within a single D flip-flop.

It is known to employ automatic computation in library development, particularly to obtain timing data by means of simulations of the transistor-level behaviour of the cells, as described by J. Dressen, 'Standard Cell Development Flow', Euro-Asic 90, pages 450–455.

An important set of data characterizing a circuit element is its truth table, which can be a fast and accurate model of the logical behaviour of the cell and can also be a reference for development of the cell library. Indeed, during the simulation of cells described in terms of hardware language the output values of the cells have to be computed whereas if a truth table model were employed these values need only be read in the output fields of the truth table.

SUMMARY OF THE INVENTION

It is accordingly one object of the present invention to provide a method and system for the automatic conversion of data representing a circuit in terms of hardware elements into data which represents a truth table.

In a preferred form of the invention, a data processor receives data which represents the circuit corresponding to a cell in the cell library as a set of equations consisting of signal entities and operational entities. The signal entities preferably consist of variables, i.e. signal values at the pins or terminals and constants. The operational entities preferably comprise combinatorial operators, corresponding to Boolean operators, and, in order that sequential circuits can be represented, primitive functions corresponding for example to a latch function and a flip-flop function. The language of the equations preferably also include other operators corresponding to an identity function (=) and an associative function, and preferably also includes a tristate function.

Each equation is parsed, namely subjected to an ordered analysis, in accordance with an abstract data tree of which the nodes each represent one of the operational entities (i.e. an operator or primitive function), the descendants of the nodes are the arguments of these operational entities and each of the extremities (i.e. the leaves of the tree) is a signal entity, namely a constant or variable. Beginning with the elementary truth tables of the signal entities, a truth table can be built for each node in ascending order to provide a truth table (herein called partial truth table) for each equation. Then a complete truth table is built by merger of the various partial truth tables.

Other objects and features of the invention will be apparent from the detailed description which follows.

DESCRIPTION OF A PREFERRED EMBODIMENT

Figure 15:
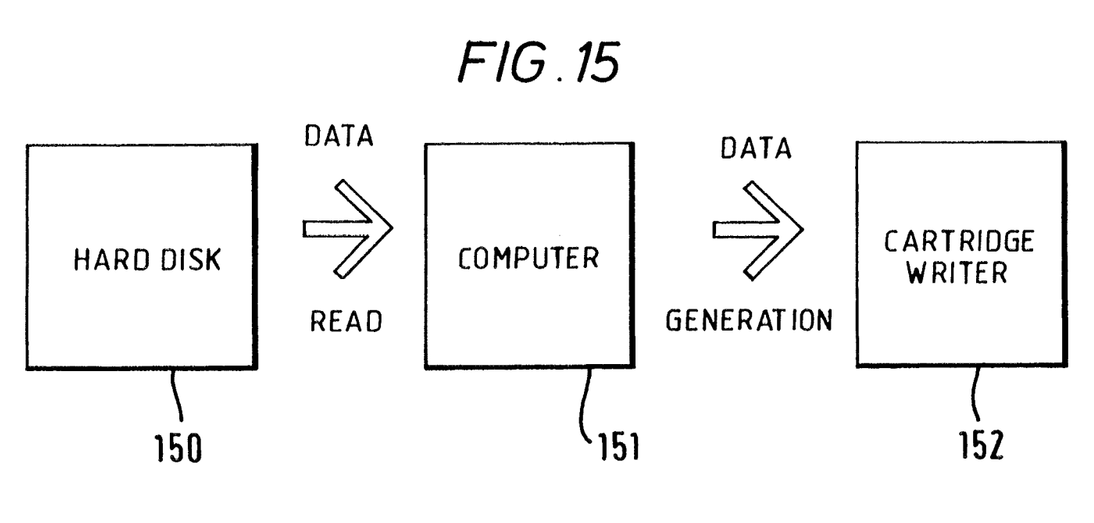
FIG. 15 shows the hardware elements of a system according to the invention.

In physical terms, a system according to the invention, as shown in FIG. 15, comprises a cell library 150 which may be embodied by a storage means such as a magnetic disk which holds data representing each of a large number of hardware circuits, in a structural form, a data processor 151 which is responsive to the cell data and programmed as described hereinafter to generate for any selected cell new data which includes a truth table, and to store the new data, including signals representing the truth table, in a storage means such as a cartridge writer 152. The important features of the invention are the format in which the cells are represented and the building of the truth tables in accordance with that format.

The logical behavior of cells in the library is described using a very simple hardware description language with a small set of signal and operational entities. The behaviour of a cell can easily be described by a set of equations which represent the connection of equipotential nodes through basic structural hardware elements or gates such as NOT, AND, OR, XOR, tristate, D flip-flop and latch. This language contains (1) constants; (2) variables; (3) basic combinatorial operators; (4) a slash operator; (5) an assign operator; and (6) a set of primitive functions. Of these, (1) and (2) are termed herein signal entities and (3) to (5) are termed operational entities.

The 'constants' correspond respectively to the 0, 1 and unknown logical levels, and are identified herein as $Low, $High and $Unk respectively.

The 'variables' are the node names, also called signal names.

The basic combinatorial operators are $NOT, $AND, $OR and $XOR which correspond to the classic Boolean operators 'not', 'and', or and 'exclusive-or' respectively.

The slash operator identified herein as '/' allows the association of two variables to describe a two-dimensional variable (i.e. a data bus), for example: A/B represents a two-dimensional value.

The assign operator identified herein as '=' allows the assignment of a variable (one-dimensional or two-dimensional) that is on the left side to an expression value on the right side.

The primitive functions are required because sequential circuits cannot be specified merely by combinatorial operators. Preferably there are three primitive functions corresponding respectively to the tristate function, the D flip-flop function and the latch function.

The function represented herein as $TRI (I, OE) corresponds to the tristate function that returns a high impedance level if OE is high and otherwise returns the logical level of the node I.

The function represented herein as $DFF (D, CP, SET, CLR, SACC) corresponds to the D flip-flop function. It returns two logical levels: the standard D flip-flop output and its complement. The D input is the data input, CP is the clock input which is active on the rising edge, SET is the active high set input, CLR is the active high clear input and SACC is a two-dimensional value which is the value returned if both SET and CLR are active.

The function represented herein as $LATCH (D, CP, SET, CLR, SACC) corresponds to the latch function. This function is identical to the $DFF function except that the clock is level sensitive, i.e. the latch output follows the data D when the clock is high, else the output holds the previous data.

Figure 1:
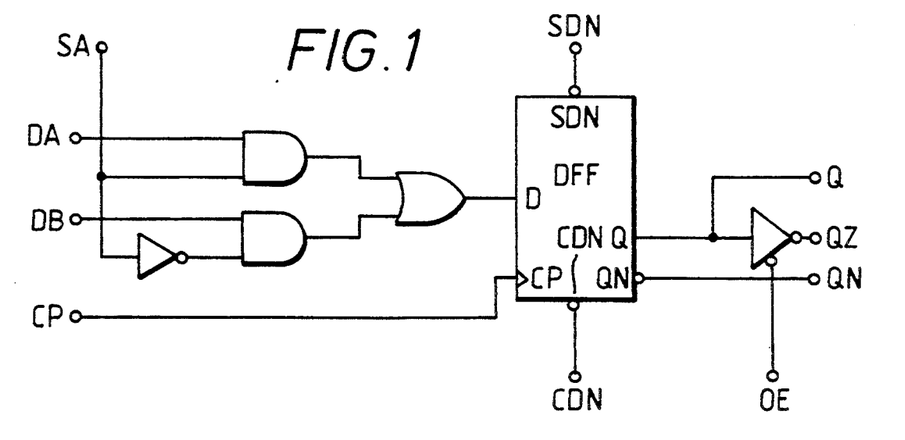
FIG. 1 is a schematic representation of an exemplary circuit, namely a multiplexed flip-flop.

FIG. 1 illustrates by way of example a typical hardware circuit or cell that is contained in a cell library. It is a multiplexed D flip-flop with (among other things) data inputs DA, DB, a set input SDN and a tristate output (Q, Qz, QN), set clear input CDN.

The multiplexed D-flip-flop of FIG. 1 can be described by the following equations:

$$D = (DA \text{ \$AND } SA) \text{ \$OR} (DB \text{ \$AND } \$NOT(SA)). \quad (i)$$

$$Q/QN = \$DFF(D, CP, \$NOT(SDN), \$NOT(CDN), \$Low/\$Low). \quad (ii)$$

$$Qz = \$TRI(Q, \$NOT(OE)). \quad (iii)$$

One important aspect of the invention is the representation of a truth table in terms appropriate for computerized analysis or synthesis of a truth table. The present invention preferably employs the following scheme. A truth table can be decomposed into:

- a list of input signal names.
- a list of output signal names.
- a list of stimuli (input) values.
- a list of output values corresponding to a set of stimuli values.

It is preferable to employ lists rather than arrays because the manipulation of truth tables requires a lot of adding and removing elements. These adding and removing operations are simpler operations on lists formed in accordance with an abstract data tree than they would be on arrays which have a fixed structure. For a general discussion of abstract data trees, reference may be made to 'Data Structures and Algorithms', Aho et al., Addison Wesley Publishing Company, 1987, pages 11–17 and 77–105.

The signal names are strings of characters, as usual in programming languages. A stimulus value can be an element of the set {0, 1, ?} if it is a 'normal' node or an element of the set {0, 1, R, F, ?} if it is a clock node. In these sets, R and F represent rising and falling respectively and the symbol ? ('don't care') value means that the output values do not depend on the value of that input node.

There are three kinds of output value:
  constants: 0, 1, X, Z, wherein X represents unknown and Z represents a high impedance level.
  one-dimensional expressions: a node value or its complement, for example sig1 is the value at node 1 and NOT(sig1) is the complement thereof.
  Boolean expressions of a node value, for example sig1AND [NOT(sig2)], namely the Boolean product of the value at node 1 and the complement or inverse of the value at node 2.

Figure 2:
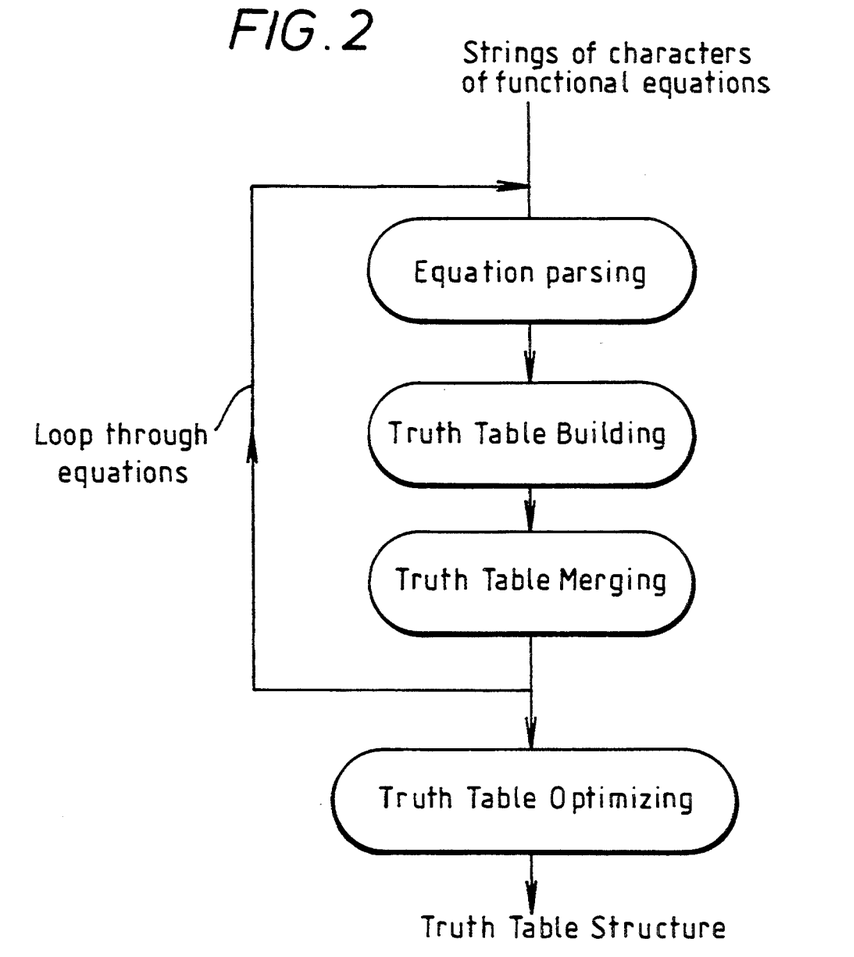
FIG. 2 is a flow chart of an automatic method for the generation of a complete truth table.

FIG. 2 is a general flow chart which illustrates the algorithm controlling the generation of a truth table of a cell. The data input comprises a set of equations defining the structure of the cell in the manner described above. 10 The procedure is recursive, and comprises building a truth table progressively from a cumulative succession of the structural equations. In each pass of the recursive loop, the i-th equation is parsed (where i varies from one to n, n being the number of equations representing the cell) and used to build a partial truth table. This truth table is (except for the first) merged with the truth table which has been formed by the merger of the truth tables for the first to (i-1)th equations.

When all the equations have been parsed to produce a cumulative or complete truth table, this truth table may, be optimized to provide the output data representing the truth table of the cell.

Optimization of the truth table means that the optimized truth table will contain 'don't care' values in its stimuli (inputs) that will reduce the number of elements in the lists of input stimuli and output values. The size reduction may be very important for some cells. For example an 8-to-1 multiplexer can be described with an 8 stimuli truth table and its full truth table has 211=2048 different combinations of stimuli, where '' denotes the exponent.

Figure 3:
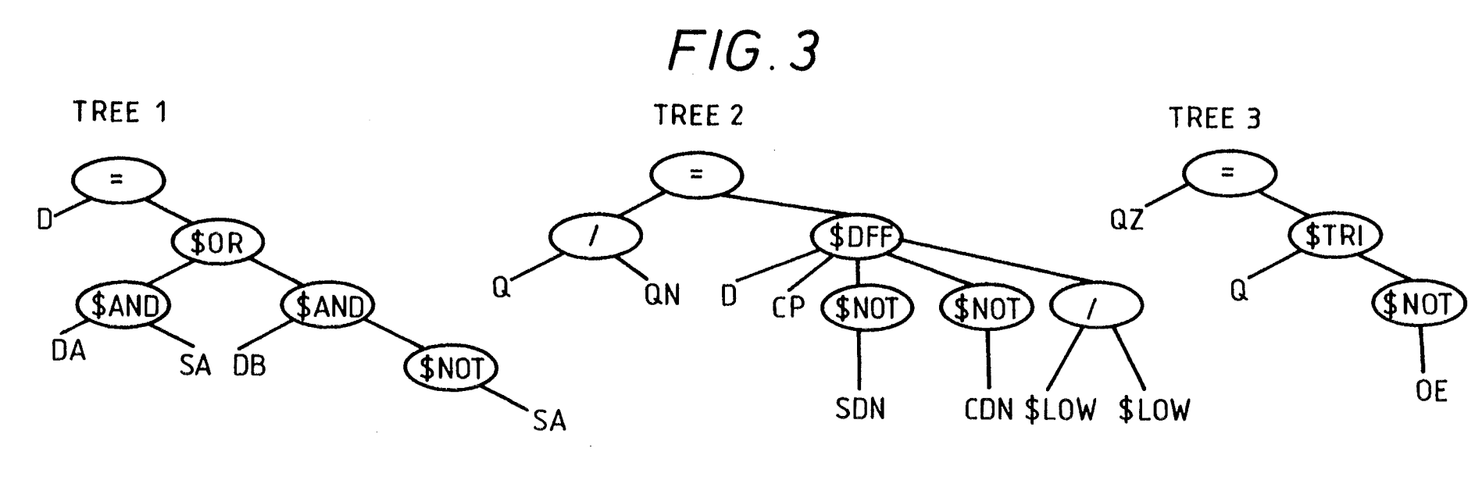
FIG. 3 illustrates abstract data trees for each of a set of equations describing the circuit.

The parsing of the equations preferably comprises the construction of an ordered abstract data tree (as defined by Aho et al.) wherein the operators and the functions are the 'nodes' of the tree, the descendants of the 'nodes' are the arguments of these operators or functions and the variables and the constants are the extremities or 'leaves' of the tree. The parsing of the equations (i) to (iii) of the cell shown in FIG. 1 is shown in FIG. 3. The 'left-to-right' order of the siblings (the children or same-generation descendants of the same node) is the order of occurrence of the arguments in the string. This 'left-to-right' order will be taken into account when the tree is read.

Figure 4:
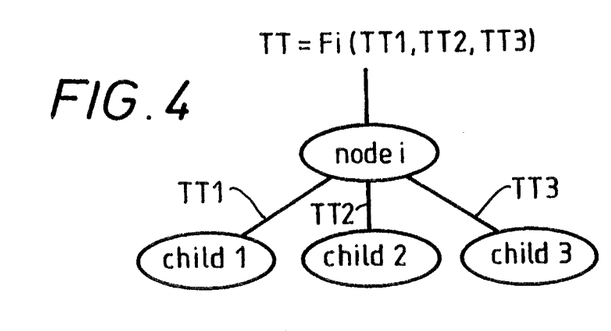
FIG. 4 illustrates the construction of a truth table of a node in an abstract data tree.
Figure 5:
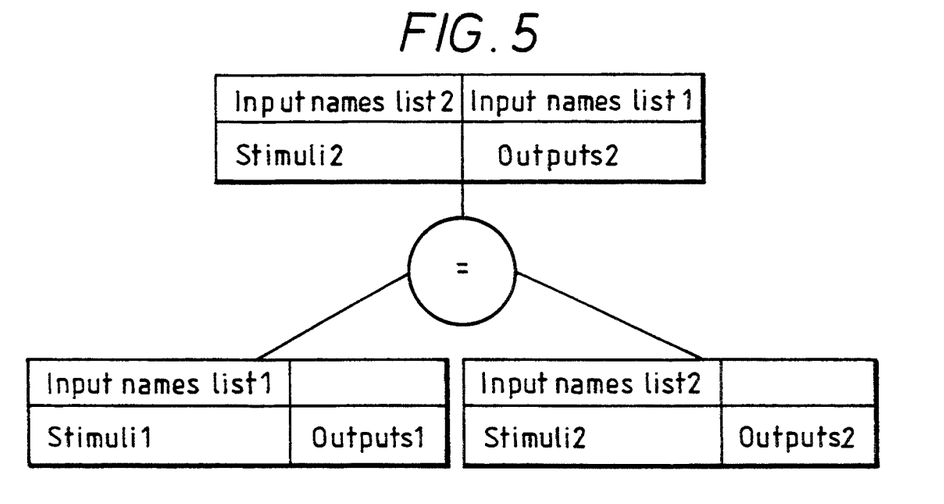
FIGS. 5 and 6 illustrate the building of truth tables.
Figure 6:
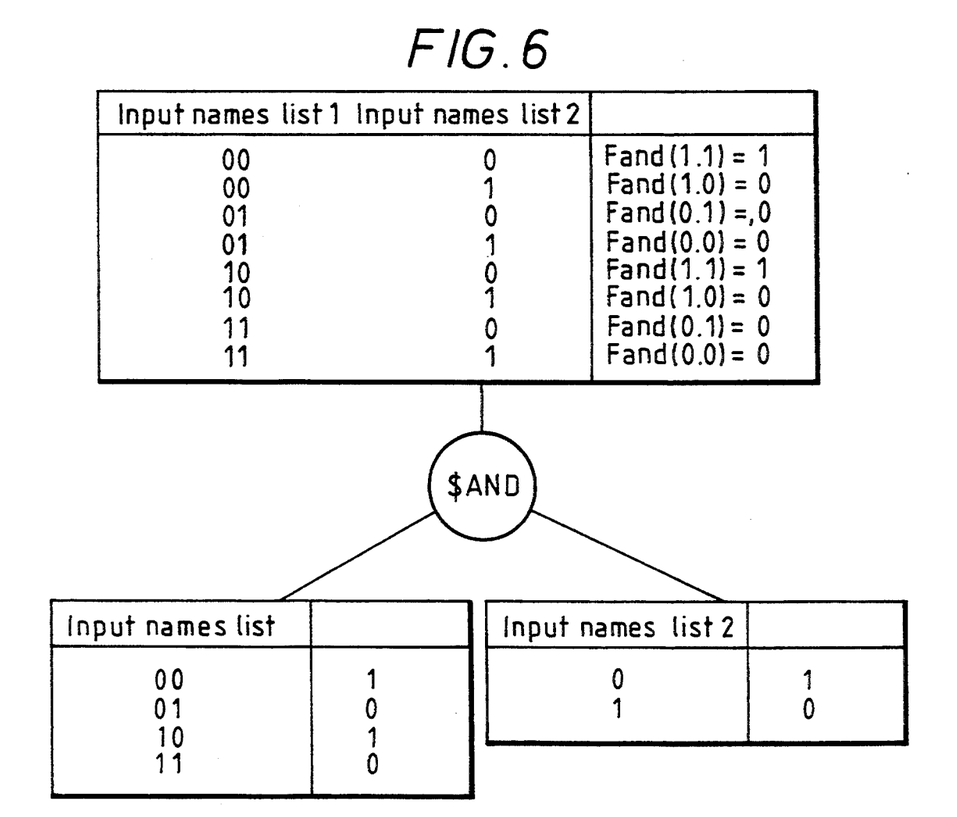

The tree structure is very suitable for recursive procedures. The truth table of a 'node' can be built from the truth table of each descendant, beginning with the simple or elementary truth tables of the constants or variables as they occur. This is shown in FIG. 4. The truth table TT on the node i depends on the truth tables TT1, TT2, TT3 of its descendants which are the arguments of the function Fi that depends on the type of the operator or primitive at the node i. Each 'leaf' stops the recursive building, because the truth table of a 'leaf' is already defined. Except for the assign operator (=), all the operators and the functions of the hardware language, build a truth table for a node in the same way. The assign operator builds a truth table by appending the input names list of the first child (the left child) to the output names list of the second child (the right child) and returning the modified second child truth table, as shown in FIG. 5. For the operators and functions, a truth table is built as shown in FIG. 6 for the operator $AND by generating all combinations of the stimuli of all children truth tables, then computing the output values for a combination from the corresponding output values of the children truth tables. Thus for each kind of operator, and function, a function Fi must be defined from the set $\{0, 1, R, F\}^N$ to the set $\{0, 1, R, F, Z, X\}^P$ where N is the number of children and P is the dimension of the returned value. The lists of input names of the children truth tables are concatenated to make the list of input names for the built truth table.

The truth tables of constants have no stimuli and each consists only of an output value that is constant. For a variable, the truth table is more complex. First, it depends on the nature of the equipotential node represented by the variable. There are two types of variable: one for the 'normal' equipotential nodes and another for the clock nodes. Hence there are two types of truth tables for an equipotential node called 'sig'. Thus the truth tables for the constants are as set forth in TABLE 1.

TABLE 1

| Truth Table for $Low | (Empty List) | → | (Empty List) |
|---|---|---|---|
| | (Empty List) | → | 0 |
| Truth Table for $High | (Empty List) | → | (Empty List) |
| | (Empty List) | → | 1 |
| Truth Table for $Unk | (Empty List) | → | (Empty List) |
| | (Empty List) | → | X |
| Truth Table for sig at normal node | SIG | → | (Empty List) |
| | 0 | → | 0 |
| | 1 | → | 1 |
| Truth Table for sig at clock node | SIG | → | (Empty List) |
| | 0 | → | 0 |
| | 1 | → | 1 |
| | R | → | R |
| | F | → | F |

Figure 7:
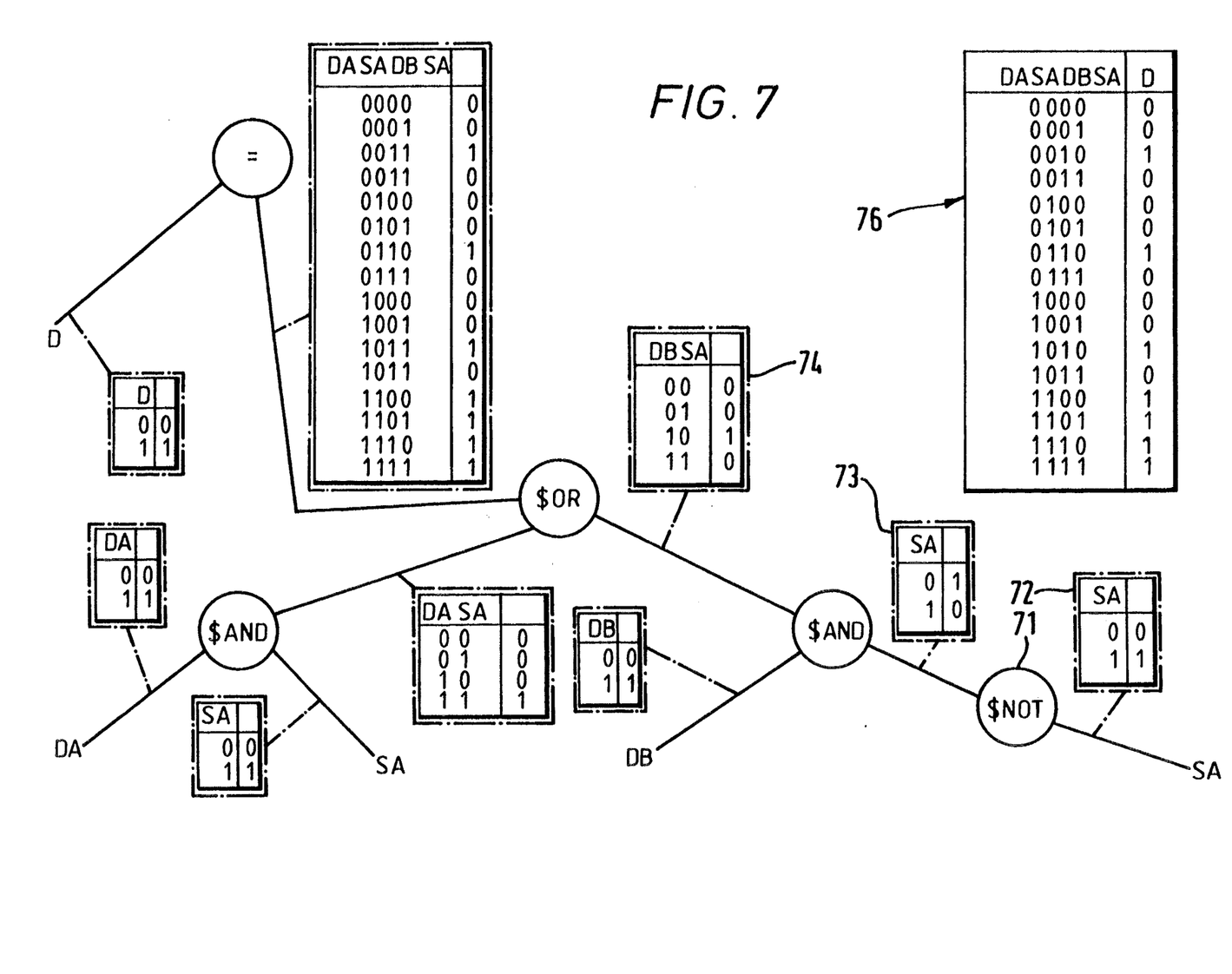
FIG. 7 illustrates the building of a truth table in an ascending order relative to an abstract data tree.

FIG. 7 shows in detail the building of the truth table for the equation (i). The structure of the tree corresponds to that shown for equation (i) in FIG. 3. FIG. 7 illustrates the construction of the truth table at each node from the truth table of its 'children'. For example, the node 71, having the operator $NOT, has the single child SA, of which the defined truth table is shown at 72. This and the other truth tables hereinafter are set out for convenience in the form shown in FIGS. 5 and 6 or Table 1, as the case may be. The truth table 73 at the node 71 is built by applying the operator of node 71 to the truth table 72. Further, the truth table 74 for the next higher node, having the operator $AND, is constructed by applying the operator to the truth table for the 'leaf' DB and the truth table 73 of the node 71. The equation (i) is progressively parsed in this way to produce the corresponding truth table 76 for the equation (i).

Figure 8:
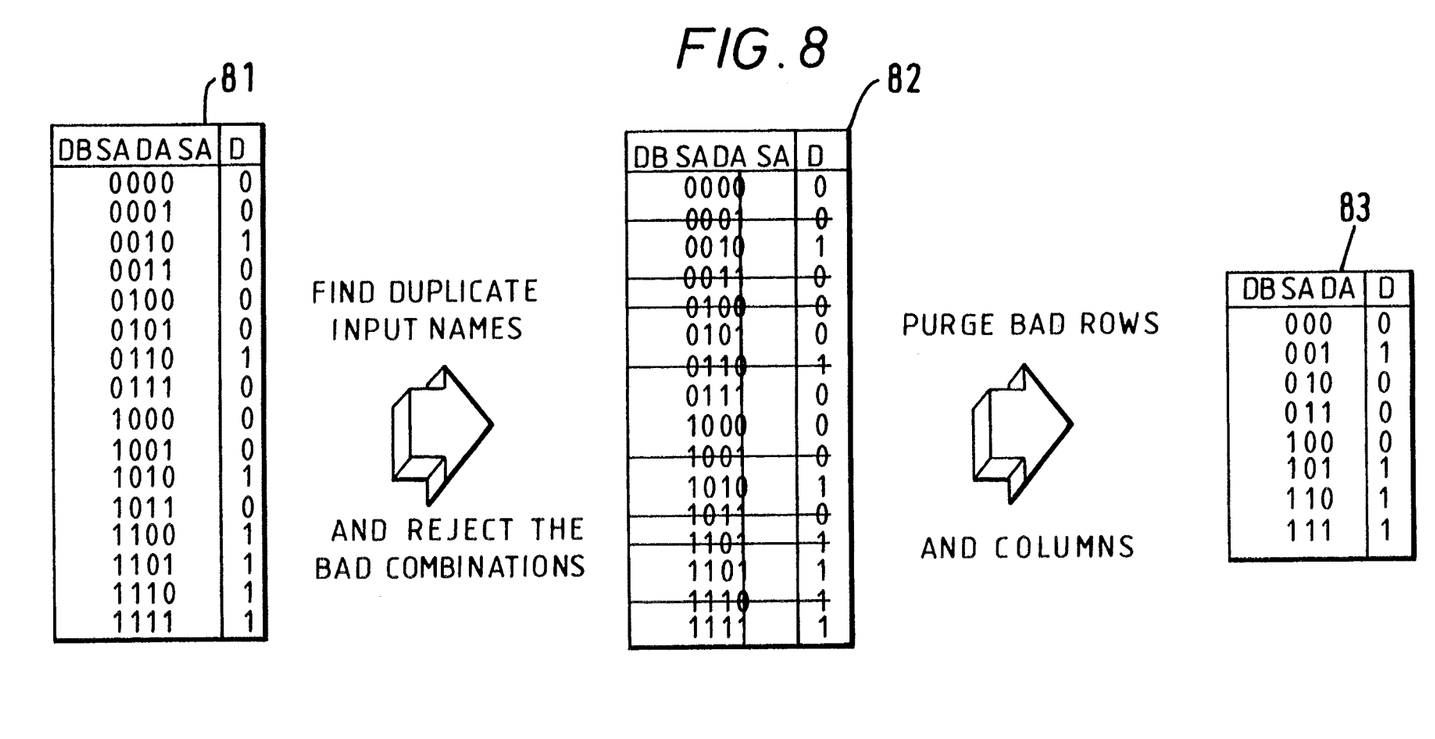
FIG. 8 illustrates a method of rationalizing a truth table to remove faults therein.

The truth table 76 in FIG. 7 has a duplicated column (SA) because in the tree there is a duplicated leaf SA. Duplication may be removed by reading the stimuli list and eliminating all the duplicated values with a validity check, such that the same signal name should not have different values in a list of stimuli. Then the list is purged from the duplicated stimuli lines. This procedure is shown in FIG. 8. The left-hand truth table 81 corresponds to the truth table shown in FIG. 7 as built for equation (i). The second row of the truth table can be eliminated by means of the validity check because it has both SA equal to zero in the second column and SA equal to unity in the fourth column of input stimuli. Likewise the fourth, fifth, seventh, tenth, twelfth, thirteenth and fifteenth rows are eliminated, as well as the fourth input column (i.e. the duplicated column for SA). The elimination of the duplicated or invalid values is shown by the scoring in the middle table 82 and the resultant, purged truth table 83 is shown to the right in FIG. 8. The duplication of the input stimuli SA has been removed and the invalid rows have been eliminated.

Figure 9:
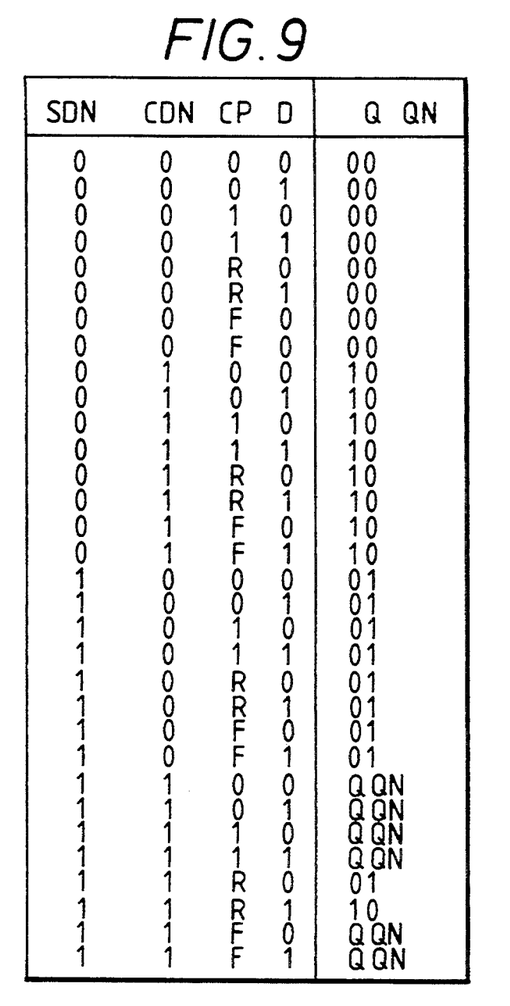
FIGS. 9 and 10 illustrate two partial truth tables corresponding to respective equations describing the circuit of FIG. 1.
Figure 10:
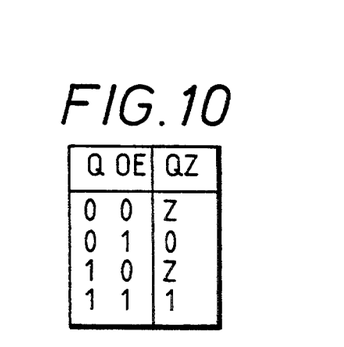

FIGS. 9 and 10 illustrates the truth tables 91 and 92 for equations (ii) and (iii), built in the same manner as described for equation (i).

In the inner loop of the algorithm, the truth tables are in accordance with the invention merged two-by-two. The merger of two truth tables is potentially complex, because there can be a loop for a signal. That means that the outputs of one truth table can be inputs for the other truth table whose outputs are also inputs of the first truth tables. One method of merger is to assume initially that the first truth table has no input after the merger, if there is a looping node, indicated by a signal in the input list and the output list, the node is removed from the input list and the output value can be computed in accordance with a Boolean expression of the looping node. Using the looping nodes. Using the assumption stated, a merger can be performed with the following operations. First, three lists are created: a list of independent input nodes, a list of the common input nodes of the truth tables and 10 finally a list of the output nodes of the first truth table which are input nodes of the second truth table. Then all combinations of input stimuli are generated and checked for validity in much the same way as the validity check is performed 'during' the building of a truth table.

Figure 11:
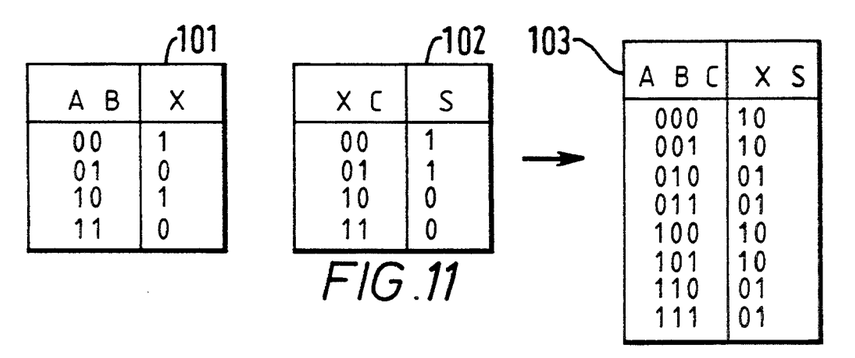
FIG. 11 illustrates the merger of two truth tables.

FIG. 11 illustrates by way of example the merger of two truth tables 101 and 102 to produce a merged table 103. The truth table 101 has inputs (stimuli) A and B and an output X. The truth table 102 has inputs X and C and an output S. The merged truth table requires inputs A, B and C and outputs x and S. Thus the independent inputs are A, B and C, there is no common input node and X is an output value in the first table and an input value (stimulus) in the second table. No conflict can exist between input nodes and conflict arising from different values of an input common to the tables does not occur in this case (unlike SA in FIG. 7). The validity check requires that in any row composed of A, B, X from table 101 and X, C and S of table 102, X should have the same value for each occurrence. Alternatively, if the output value were an expression, the corresponding stimuli should be compatible.

For every row of table 101, the system generates signals corresponding to each row of table 102 and eliminates those combinations which fail the validity check. Thus for the first row of table 101, having A=B=0 and X=1, the first and second rows of table 102 are eliminated, because X=0. The combinations of the first row of table 101 and the third and fourth rows of table 102 give the first and second rows of table 103.

By means of the merger of the partial truth tables (one for each equation) the complete truth table is built. It contains all the combinations of stimuli of the input signals. The number of combinations is $(2^{**}p)*(4^{}m)$ wherein p is the number of 'normal' input nodes and m is the number of clock input nodes. For the cell in FIG. 1 the number of combinations is $(2^{}6)*(4^{**}1)=256$. This number can be reduced by using 'don't care' values in two ways, Boolean optimizing and expression optimizing.

Boolean optimizing consists of examining the output values of adjacent stimuli and, if they match, replacing the adjacent stimuli by one with a 'don't care' value on the changing input signal. Thus for example if there are two sets of input values 0000 and 0100 each associated with the same set of output values 011. The second stimulus in ,the input set can be replaced by a 'don't care' and the two rows of the truth table can be reduced to a single row: 0?00→011. 'Expression' optimizing is nearly the same as Boolean optimizing except that instead of a check of equality of the output values one output value of adjacent stimuli may be replaced by a one-dimensional expression of the changing signal. Thus for example in the truth table:

| I1 | I2 | I3 | → | O1 | O2 |
|---|---|---|---|---|---|
| 0 | 1 | 0 | → | 0 | 1 |
| 0 | 1 | 1 | → | 1 | 1 | wherein the top row comprises the lists of signal names and the lower rows the values in the truth table, the lower rows may be replaced by a single row:

0 1 ?→I3 1 wherein I3 in each row is replaced by the 'don't care' value and the output signal O1 is replaced by the third input value I3 (i.e. a one-dimension expression of the signal which changes from one row to the next).

Figure 12:
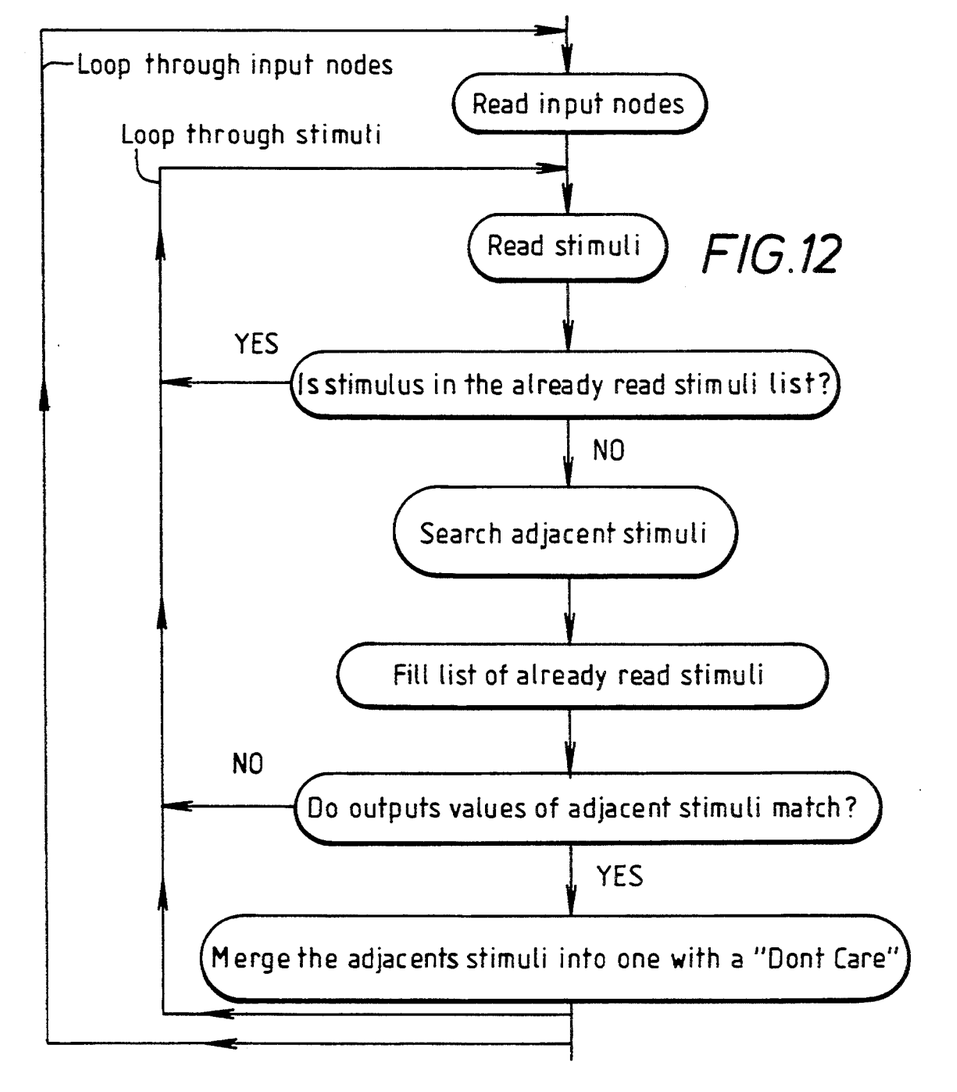
FIG. 12 is a flow chart showing the optimizing of a truth table.

The Boolean optimizing is performed by repeatedly traversing basic optimizing steps and finishing when no change occurs in the last basic step. The basic optimizing steps consist of looping through the list of input nodes, then looping through the lists of stimuli and testing whether the output values match or not. FIG. 12 shows the basic optimizing routine. There are two adjacent stimuli for the changing node is a 'normal' node while there are four adjacent stimuli for a clock node.

Figure 13:
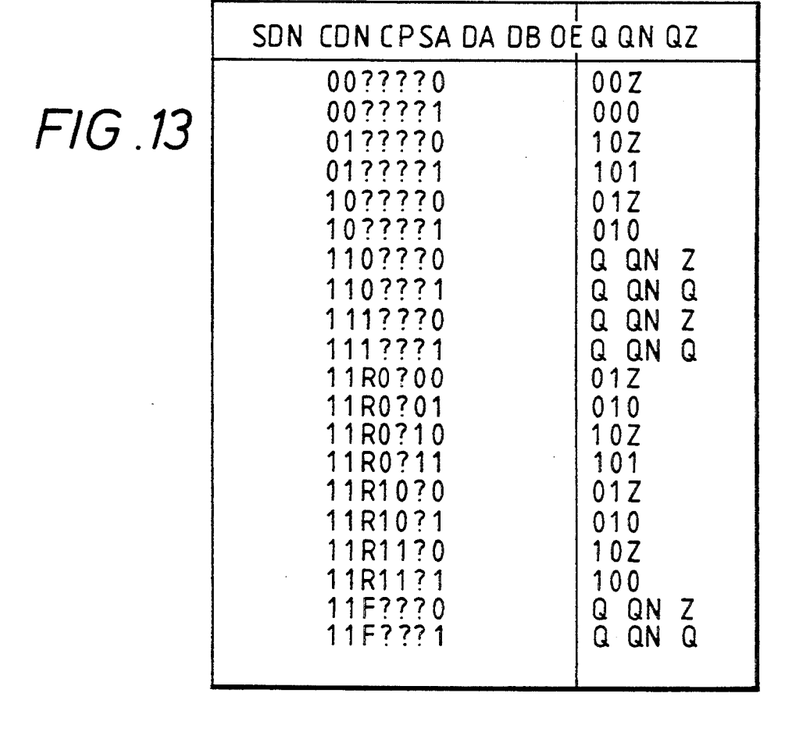
FIG. 13 is a Boolean optimized truth table for the circuit of FIG. 1.

FIG. 13 illustrates the truth table obtained by performing beth Boolean optimization of the truth table (not shown) formed by merger of the partial truth tables obtained in accordance with the three equations for the circuit of FIG. 1. FIG. 13 can be expressed as a list of input signal names SDN to OE inclusive, a list of output signal names Q, QN and QZ, a list of input stimuli represent all possible non-redundant combinations of values of the input stimuli and a list of corresponding output values.

The expression optimizing is performed in the same way as the Boolean optimizing except that the test for a match between values corresponding to adjacent combinations of stimuli is replaced by examining the output nodes in turn and replacing the output value by 0 if both values of the output node corresponding to adjacent sets of stimuli are 0; and 1 if both values of the output node corresponding to adjacent sets of stimuli are 1, sig if the value of the output node is 0, when sig (the changing signal) is 0, and 1 when sig is 1; and sig if the value of the output node is 0, when sig (the changing signal) is 1, and 1 when sig is 0.

Figure 14:
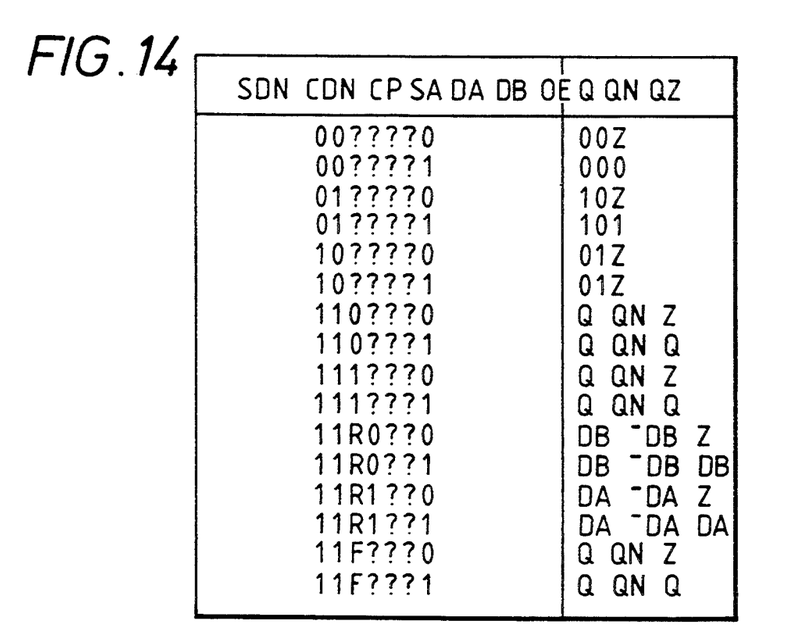
FIG. 14 is an expression optimized, final truth table for the circuit of FIG. 1.

FIG. 14 shows the final truth table for the circuit of FIG. 1. As indicated earlier, data representing this truth table is stored by the system in the storage means 152.

The foregoing description is intended to be by way of illustration and not limitation of the invention, which is defined by the claims that follow.

I claim:

1. A method of automatically generating signals representing a complete truth table of a circuit from data defining said circuit by a set of equations consisting of signal entities and operational entities, comprising the steps of:

performing in a data processor:
   (a) parsing each equation in accordance with an abstract data tree having a node for each operational entity and an extremity for each signal entity;
   (b) building, in accordance with the parsing of each equation and from elementary truth tables for each signal entity, a respective partial truth table for each equation; and
   (c) merging the said partial truth tables into said complete truth table for said circuit; and storing signals representing said complete truth table.

2. A method of automatically generating signals representing a truth table of a circuit from data stored in a cell library, said data defining said circuit in terms comprising constants, variables, operators and primitive functions, whereby the said circuit can be structurally described by a set of equations consisting of said terms, said method comprising the steps of:

reading said data from the cell library to a data processor and performing in said data processor the following steps:
   (i) parsing each equation in accordance with a corresponding abstract data tree having nodes and extremities, assigning to each node a respective one of the operators and primitive functions and assigning to each extremity a respective one of the constants and variables;
   (ii) building, in an ascending order determined by the respective tree, truth tables for each node thereof from the truth tables of the descendants of said each node, whereby a respective partial truth table is built for each equation; and
   (iii) merging the said partial truth tables into a complete truth table for said circuit; and storing signals representing said complete truth table.

3. A method according to claim 2 further comprising applying Boolean optimization to the said complete truth table.

4. A method according to claim 2 further comprising applying expression optimization to said complete truth table.

5. A method according to claim 2 wherein the constants represent zero, unity and unknown logic levels.

6. A method according to claim 2 wherein the variables comprise terminal signal values.

7. A method according to claim 2 wherein the said operators are combinatorial operators.

8. A method according to claim 7 wherein the said operators correspond at least to the functions NOT, AND, OR and EXCLUSIVE-OR.

9. A method according to claim 2 wherein the said primitive functions comprise at least one of a tristate function, a flip-flop function and a latch function.

10. A method according to claim 2 wherein the building step (ii) includes removing from the truth table for a node any duplication of values and any logically inconsistent set of values.

11. A system for automatically generating signals representing a truth table of an electrical circuit from data stored in a cell library, said data defining said circuit in terms of constants, variable, operators and primitive functions, whereby the said circuit can be structurally described by a set of equations consisting of said terms, said system comprising:

storage means for said data;

a data processor for reading said data and performing the following steps:
   (i) parsing each equation in accordance with a corresponding abstract data tree having nodes and extremities, assigning to each node a respective one of the operators and primitive functions and assigning to each extremity a respective one of the constants and variables;
   (ii) building, in an ascending order determined by the respective tree, truth tables for each node thereof from the truth tables of the descendants of said each node, whereby a respective partial truth table is built for each equation; and
   (iii) merging the said partial truth tables into a complete truth table for said circuit; and means coupled to said data processor for storing signals representing said complete truth table.

12. A system according to claim 11 wherein said data processor is further arranged to perform optimization of the said complete truth table and said signals represent an optimized version of said complete truth table.

* * * * *